United States Patent
Esposito et al.

(10) Patent No.: US 10,833,571 B2
(45) Date of Patent: Nov. 10, 2020

(54) MOUNTING PEG (71) Applicant: JUKEN SWISS TECHNOLOGY AG, Grenchen (CH)

(72) Inventors: Rodolfo Esposito, Colombier (CH); Gerardo Garcia, Tolochenaz (CH); Daniel Maeder, Tavannes (CH)

(73) Assignee: JUKEN SWISS TECHNOLOGY AG, Grenchen (CH)

( * ) Notice: Subject to any disclaimer, the term of this patent is extended or adjusted under 35 U.S.C. 154(b) by 797 days.

(21) Appl. No.: 15/507,235

(22) PCT Filed: Aug. 29, 2014

(86) PCT No.: PCT/EP2014/068437
§ 371 (c)(1),
(2) Date: Feb. 27, 2017

(87) PCT Pub. No.: WO2016/029973
PCT Pub. Date: Mar. 3, 2016

(65) Prior Publication Data
US 2017/0264180 A1    Sep. 14, 2017

(51) Int. Cl.
*H02K 37/24* (2006.01)
*H02K 5/22* (2006.01)
(Continued)

(52) U.S. Cl.
CPC .......... *H02K 37/24* (2013.01); *F16B 5/0088* (2013.01); *F16B 5/0664* (2013.01); *H02K 5/225* (2013.01);
(Continued)

(58) Field of Classification Search
CPC .......... F16B 2/04; F16B 2/243; F16B 5/0084; F16B 5/0088; F16B 5/0664; F16B 19/10;
(Continued)

(56) References Cited

U.S. PATENT DOCUMENTS 324,450 A * 8/1885 Andrews ................. F16B 2/065
403/290
1,840,928 A * 1/1932 Anthony ............. F16B 19/1081
411/80.2
(Continued)

FOREIGN PATENT DOCUMENTS

CN 102584473 A 7/2012
DE 93 02 589 U1 7/1993
(Continued)

OTHER PUBLICATIONS

Translation of JP 2012-060791. Fukuda, et al. Fixing Structure for Installation Object. Mar. 22, 2012.*
(Continued)

*Primary Examiner* — Josh Skroupa
(74) *Attorney, Agent, or Firm* — Maschoff Brennan (57) ABSTRACT A press-fit mounting peg (2) for retaining a component such as a stepped-motor on a circuit board (21). The mounting peg (2) is securable in a mounted position by a first axial displacement of a locking pin (17) along a pin channel (16) of the press-fit mounting peg (2) in a first axial direction along a longitudinal axis of the press-fit mounting peg (2) from a first axial position to a second axial position. The pin channel (16) comprises at least one pin displacement stop (13, 20) for stopping a second axial displacement of the locking pin (17) out of the second axial position.

13 Claims, 6 Drawing Sheets (51) Int. Cl.
*F16B 5/00* (2006.01)
*F16B 5/06* (2006.01)

(52) U.S. Cl.
CPC .. *H02K 2211/03* (2013.01); *H05K 2201/1059* (2013.01); *H05K 2203/167* (2013.01); *Y10T 403/535* (2015.01)

(58) Field of Classification Search
CPC .......... F16B 21/08; F16B 21/10; F16B 21/12; F16B 21/183; H02K 5/00; H02K 5/225; H02K 37/24; H02K 2211/03; H05K 1/18; H05K 3/306; H05K 3/325; H05K 2201/1009; H05K 2201/01568; H05K 2201/0159; H05K 2203/167; Y10T 403/53; Y10T 403/535; Y10T 403/59; Y10T 403/7015; Y10T 403/7058
USPC .......................... 403/289, 290, 321, 353, 371
See application file for complete search history.

(56) References Cited

U.S. PATENT DOCUMENTS

| | | | | |
|---|---|---|---|---|
| 3,710,674 | A * | 1/1973 | Tabor | F16B 19/1081 403/290 |
| 6,104,614 | A | 8/2000 | Chou et al. | |
| 6,116,566 | A | 9/2000 | Brown et al. | |
| 6,194,797 | B1 * | 2/2001 | Simon | H02K 1/14 310/43 |
| 6,366,465 | B1 | 4/2002 | Baur et al. | |
| 6,534,888 | B1 | 3/2003 | Vorberg et al. | |
| 7,828,372 | B2 * | 11/2010 | Ellison | B60R 13/04 24/297 |

FOREIGN PATENT DOCUMENTS

| | | | | |
|---|---|---|---|---|
| EP | 1 021 076 | A2 | 7/2000 | |
| JP | 11247812 | A * | 9/1999 | .............. F16B 19/10 |
| JP | 2007202323 | A * | 8/2007 | .............. H02K 5/00 |
| JP | 2012-60791 | A | 3/2012 | |
| RU | 2551929 | C2 | 6/2015 | |
| WO | WO-2010116939 | A1 * | 10/2010 | ........... F16B 5/0664 |

OTHER PUBLICATIONS

JP Office Action dated Aug. 21, 2018 as received in Application No. 2017-530406.
CN Office Action dated Sep. 12, 2018 in application No. 201480081524.6.
International Search Report dated Apr. 28, 2015 as received in Application No. PCT/EP2014/068437.
Written Opinion of the International Searching Authority dated Apr. 28, 2015 as received in Application No. PCT/EP2014/068437.
RU Office Action dated Mar. 22, 2018 as received in Application No. 2017107876/07.

* cited by examiner

MOUNTING PEG

TECHNICAL FIELD

The present invention relates to the mounting of solderless components on a printed circuit board (PCB). In particular, but not exclusively, it relates to the solderless mounting of electrical or electronic components, such as stepper motors for example, on a PCB. Such a component may be, for example, a miniature stepper motor for use in automotive instrumentation applications. The invention likewise relates to a mounting peg and to an assembly comprising the solderless mounted component.

BACKGROUND OF THE INVENTION

Components such as miniature stepper motors, are widely used, for instance in the automotive industry. They may be mounted directly on a PCB. The necessary electrical and mechanical connections can be achieved for instance by soldering the connectors of the motor to the PCB. However, solderless assembly allows electrical and/or mechanical connection to be established between component and PCB without soldering or permanent mechanical fixing of the component to the PCB. Such solderless mounting may be achieved by mechanical deformation of a connector in an opening, such as a drill hole of the PCB. The electrical connection may also be achieved by inserting a connector into a deformable opening in the PCB. In order to ensure a reliable mechanical (and therefore electrical) connection of solderless components to a PCB, it has been proposed to lock the press-fit mounting pegs in their mounted position by pushing a locking pin axially through the mounting peg, thereby forcing the walls of the mounting peg apart and against the side-walls of the mounting hole in the PCB through which the mounting peg has been inserted.

Nevertheless, even with the use of a locking pin in such mounting pegs, there is a need for still greater reliability in the mounting pegs of components on circuit boards. In the field of automotive electronics, for example, every possible precaution must be taken to ensure that automatically-mounted components are firmly mounted and remain in mechanical and electrical contact with the PCB on which they are mounted, despite large fluctuations in temperature, humidity, mechanical shock, mechanical stress and vibration etc. Under such conditions over extended periods of time, a locking pin may become dislodged, or be deformed, or otherwise lose its mechanical integrity. PCB holes may also become slightly enlarged, or otherwise deformed. Even a tiny amount of play in the fit between the mounting peg and the PCB hole may allow a gradual and progressive loosening of the press-fit. In such cases, there is a finite possibility that a prior art mounting peg, even when using a locking pin, may fail.

SUMMARY OF THE INVENTION

It is an aim of the present invention to overcome the problems related to mounting components, such as motors, to a support such as a circuit board.

According to a first aspect of the invention, there is provided a mounting peg for retaining a component on a circuit board as recited in claim 1.

By means of a pin displacement stop, the locking pin can be reliably kept in its locking position when the mounting peg is in the mounted position. Even if the circuit board is subject to shock or vibration or temperature changes, the risk of the locking pin being accidentally dislodged when the mounting peg is in the mounted position is greatly reduced.

According to a second aspect of the invention, a stepper-motor comprising at least one mounting peg according to the first aspect is provided.

According to a third aspect of the invention, there is provided a circuit board for a dashboard of a vehicle, the circuit board comprising the stepper-motor according to according to the second aspect of the invention.

Other aspects of the invention are set out in the dependent claims.

BRIEF DESCRIPTION OF THE DRAWINGS

Other features and advantages of the invention will become apparent from the following description of non-limiting exemplary embodiments, with reference to the appended drawings, in which.

DETAILED DESCRIPTION OF EMBODIMENTS OF THE INVENTION

Embodiments of the present invention are described below in more detail with reference to the attached figures. One aspect of the invention relates to a mounting peg for retaining a component on a mounting (eg circuit) board. In the following exemplary description of embodiments of the present invention, the example is taken of a stepper motor mounted on a PCB. However, the invention is not limited to the context of stepper motors mounted on PCBs.

Figure 1:
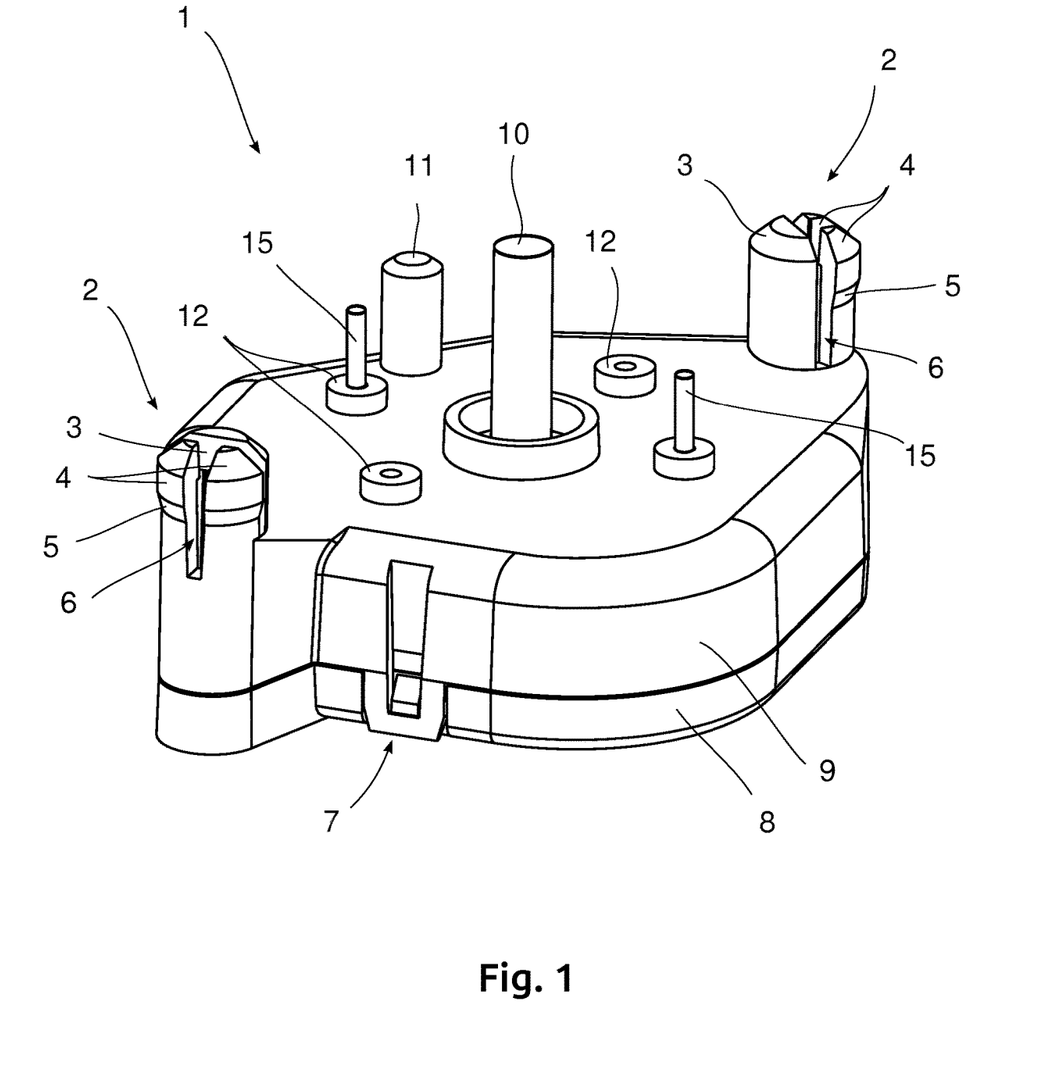
FIG. 1 is an isometric view of a stepper motor according to an embodiment of the present invention.

FIG. 1 shows an isometric view of the board-facing surface of a stepper motor 1 according to the invention. In this example, the stepper motor 1 comprises a rotating shaft 10, to which a pointer (not illustrated) may be affixed. Such a stepper motor may be used in a vehicle instrument cluster, for example. The pointer shaft 10 may be transparent or translucent and may be at least partly encased in a sleeve or enclosing element which is arranged to reduce any stray light, and therefore does not disturb the illumination of the instrument cluster. As can be seen in this example, on the board-facing surface, the stepper motor also comprises a guide peg 11 for locating the stepper motor 1 in the correct position on the PCB, for example during an automated pick-and-place mounting procedure of components on the PCB.

The stepper motor 1 in this example comprises a two-part case: a lower or board-facing part 9 and an upper part 8 (upper and lower do not refer here to the drawing, but to the orientation of the motor once mounted on the PCB). One or both parts 8 and 9 may be manufactured by injection moulding, for example. These two parts of the stepper motor case may be held together by clips such as the one indicated by the reference number 7, formed in the same injection moulding process. Spacers 12 may be provided on the board-facing surface of the case of the stepper motor 1 in order to provide a stable mount and an accurate height of the component (stepper motor 1) above the surface of the PCB. The stepper motor 1 may also comprise a plurality of electrical connector pins 15, arranged to create an electrical contact between the stepper motor 1 and conductive tracks of the PCB. Such connections may be made by means of push-fit electrical pin connectors in known fashion.

The example motor 1 comprises press-fit mounting pegs 2. In this example two press-fit mounting pegs 2 are provided on the board-facing side, for mechanically retaining the motor on the PCB. Each press-fit mounting peg 2 has a waist portion whose diameter substantially matches the diameter of the PCB hole into which it will fit, while the distal end of the press-fit mounting peg is wider than the PCB hole. In this example the distal end is chamfered, and compression gaps 6 are provided such that, as the press-fit mounting peg 2 is pressed into the PCB hole, the wider part of the distal end of the mounting pegs 2 is temporarily compressed inwards by the force exerted by the hole walls as the pin passes through the PCB hole, and then expands outwards again when it emerges on the other side of the PCB to reach its nominal (substantially uncompressed) diameter. Thus, a mechanical connection is obtained by shaping the press-fit mounting peg 2 so that it is slightly deviated in size from the nominal dimension when its distal end is passed through the hole in the PCB. The degree of tightness can be adjusted based on the amount of the deviation. It is also possible that the press-fit mounting peg described above, when pushed through the hole in the PCB, opens wider than in its nominal state, thereby mechanically holding the motor in position. This kind of peg may be called an active peg. Note that references to "outwards" and "inwards" in this description are intended to refer substantially to the radial directions away from and towards, respectively, a central longitudinal axis of the pin channel 16 of each press-fit mounting peg 2.

To this end, the press-fit mounting pegs 2 are preferably made from an elastically deformable or otherwise resilient material such as a polymeric plastics material. The mounting peg may be a few mm in diameter. The lower part 9 of the case and the mounting pegs 2 may advantageously be formed contiguous with one another, fabricated from the same material in the same moulding process.

As can be seen in the figures, for facilitating the insertion of the press-fit mounting pegs 2 into the holes in the PCB, the fingers 3, 4 in this example each have a chamfered end. The edges of the holes in the PCB into which the mounting peg 2 will be pressed may also be correspondingly beveled. The chamfer forms a guide for the press-fit mounting pegs 2, helping (a) to distribute the force evenly around the circumference of the hole, (b) to allow the compression of the pin walls 3, 4 to occur gradually, thus rendering the press-fit operation smoother, more easily controlled, and requiring less power (less force at any one instant of time), and (c) to assist in aligning the pin parallel with the hole it is being pressed into.

As shown in the figures, in the illustrated embodiments each of the mounting pegs 2 comprises three longitudinal or axial wall sections 3, 4, also referred to as fingers 3, 4, with a slit or space 6 between the fingers 3, 4. In other words, the mounting pegs 2 have a hollow structure so that a channel 16, also referred to here as a pin channel 16, is formed in the mounting pegs 2, so that the fingers 3, 4 are arranged around the pin channel 16. In this example the pin channel 16 has a slightly tapered shape so that the diameter of the pin channel 16 gradually becomes smaller towards the distal end of the pin channel. The diameter of the pin channel can be reduced by pushing the channel walls, i.e. the mounting peg walls, inwards or towards the pin channel. In a normal state, when no force is exerted on the channel walls, the outer diameter of the distal end is slightly larger than the diameter of the waist or middle section of the mounting pegs 11. In this example, the larger outer diameter is obtained in that two of the fingers 4 have a thickened portion 5 close to the distal end of the fingers 4, while one of the fingers 3 has a flush outer surface. A mounting peg 2 having at least one finger with a flush outer surface is easier to push the through a hole in the PCB than a mounting peg 2 in which all fingers 3, 4 comprise a thickened portion.

Figure 2A:
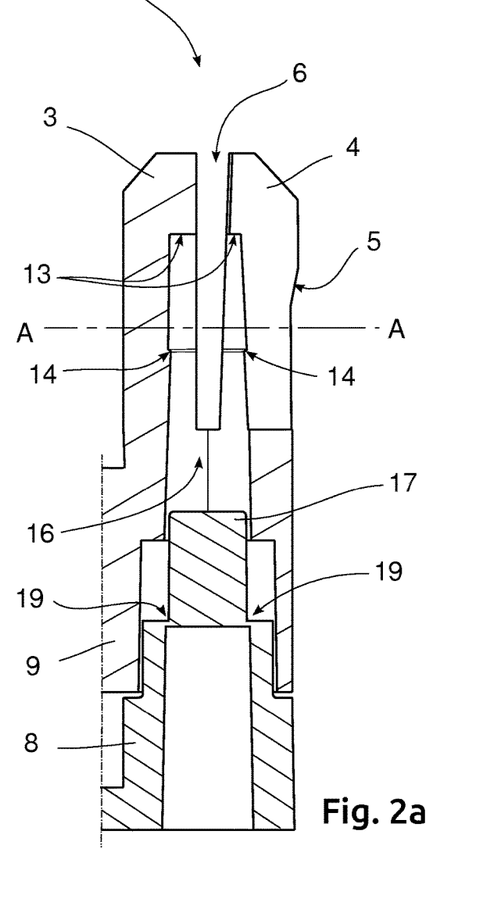
FIG. 2a shows a vertical sectional view of an example of a mounting peg according to an embodiment of the invention, with a locking pin in its initial position.
Figure 2B:
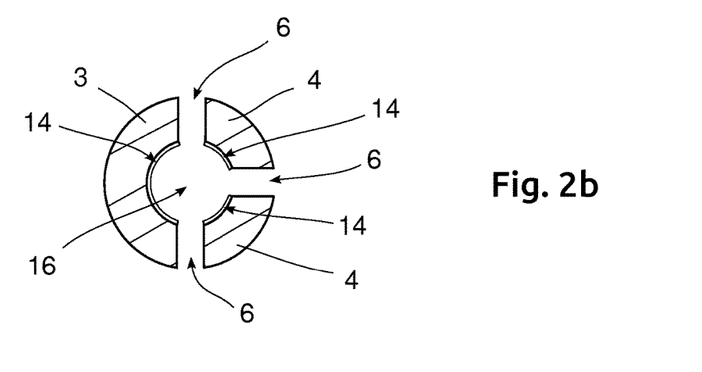
FIG. 2b shows a cross-sectional view of the mounting peg of FIG. 2a through A-A, with the locking pin in its initial position.
Figure 2C:
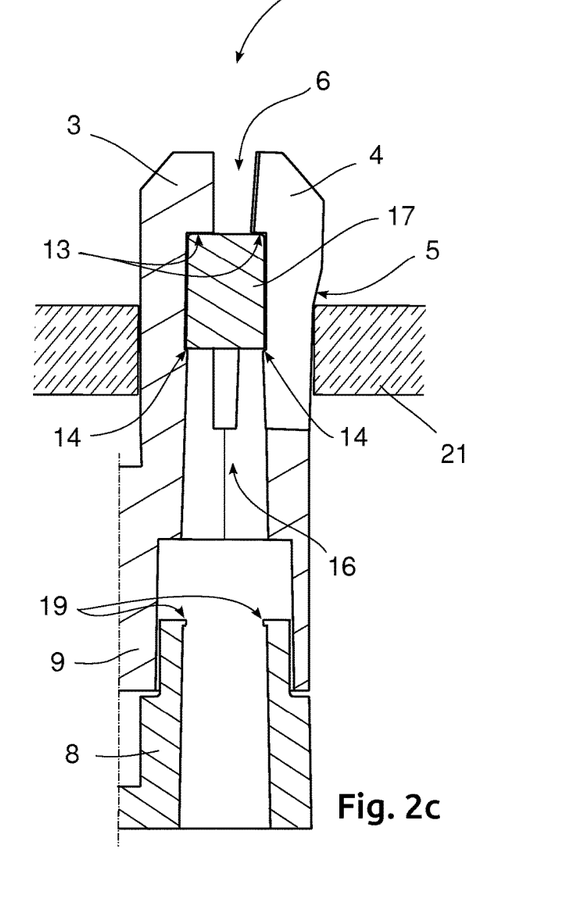
FIG. 2c shows a vertical sectional view of the mounting peg of FIGS. 2a and 2b, with the locking pin in its locking position.
Figure 3A:
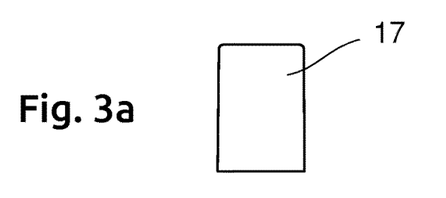
FIGS. 3a and 3c show side elevations of two variants of a locking pin for use with a mounting peg according to the present invention.
Figure 3B:
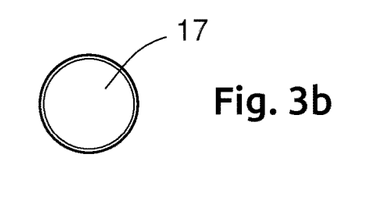
FIGS. 3b and 3d show plan views of the locking pins of FIGS. 3a and 3c respectively.
Figure 3C:
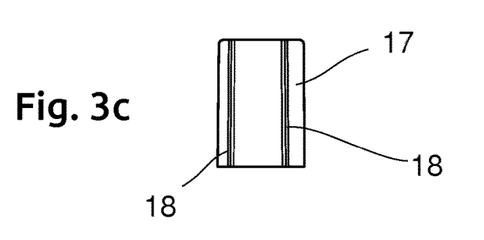
Figure 3D:
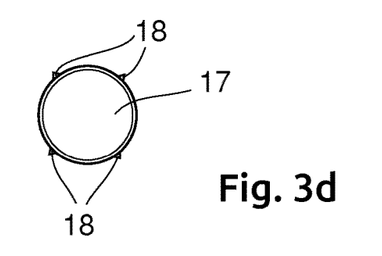

In the pin channel 16 is a locking pin 17, as for example shown in FIGS. 3*a* to 3*d*. The locking pin in this example is made of plastic, although other materials are also possible. The locking pin may be only 1 mm to 3 mm in diameter. In this example the locking pin 17 is hard and rigid, and may have a cylindrical, conical or slightly tapering shape. As shown in FIG. 2*a*, which illustrates in more detail the first embodiment of the present invention, the locking pin 17 may be held in place in an initial position in the pin channel by pin holding means 19, when the pin is in an unlocking or initial state. The locking pin may thus be part of the moulding which forms the upper part 8 of the motor case. FIG. 2*b* is a cross-sectional view of the peg through plane A-A in FIG. 2*a*. When pin holding means 19 have been broken, and the mounting pegs 2 have been pushed in a first axial direction through the holes in the PCB, the mounting pegs 2 can then be locked in their mounted position as explained below in more detail. The locking pin 17 is then axially displaced along a longitudinal axis of the mounting peg 2 from a first position down to a second or locking position as shown in FIG. 2*c*. It is also possible to design the mounting peg 2 so that, when moving the locking pin 17 in the first axial direction, the outer diameter of the mounting peg 2 expands slightly at the level of the PCB, thereby creating a tighter mechanical connection between the mounting peg 2 and the PCB.

As long as the locking pin 17 is in the locking position, there is no risk that the mechanical connection between the motor 1 and the PCB 21 could somehow be accidentally loosened or detached, and the mounting peg 2 is thus secured in its mounted position. To minimise any risk that the locking pin 17 could be accidentally dislodged from this locking position, at least one pin displacement stop is provided according to the present invention for preventing a further axial displacement of the locking pin out of the locking position.

According to the first embodiment, as illustrated in FIGS. 2a to 2c, the pin displacement stop comprises a first displacement stop 14 for stopping movement of the pin 17 back towards its initial position, and a second displacement stop 13 for stopping a pin movement from its locking position toward the distal end of the mounting peg 2. According to this example, the first displacement stop comprises a shoulder, protrusion or ridge 14 running partly or completely around the wall of the pin channel 16. The shoulder or ridge may be configured to be deformed outwardly by the first axial displacement of the locking pin 17 as the locking pin passes the deformable protrusion, and to resile inwardly after the locking pin has passed. The shoulder or ridge 14 and the locking pin 17 may be formed from the same material. Alternatively, they may be formed from different materials. Once the locking pin has been pushed past the first pin displacement stop, the locking pin is unable to travel back towards its initial position unless a great and sustained force is applied to the locking pin 17 in that direction (referred to as the second axial direction).

In the example shown in FIGS. 2a to 2c, the second displacement stop comprises a shoulder or protrusion 13 formed in the wall of the pin channel or at the distal end of the pin channel 16. It would also be possible to have more than one finger formed with such a shoulder or protrusion. The shoulder or protrusion 13 is shaped for engaging with a distal end of the locking pin 17 so as to prevent a displacement of the distal end of the locking pin 17 past the shoulder or protrusion 13. In the illustrated example, the shoulder is formed on the inner wall of one of the fingers 3, 4 at the distal end of the pin channel 16. According to this example, the shoulder 13 comprises the same material as the remaining parts of the mounting peg 2. Instead of a shoulder, the second displacement stop could also be another kind of stop. For instance, it could be an axially-running elastically-deformable rib, or a plurality of elastically deformable axial ribs, having a function similar to the ribs 20 described with reference to the second embodiment.

Possible configurations of the locking pins 17 of FIGS. 2a and 2c are illustrated more in detail in FIGS. 3a to 3d. As can be seen in these examples, the locking pins may have a conical or slightly tapering structure so that the distal end, which engages with the second displacement stop, is slightly narrower than the proximal end, which is initially held by pin holding means 19. The distal end of the pin may have a rounded or chamfered end to make it easier to pass the ridge 14 or to move along the ribs 20 described below. The pin illustrated in FIGS. 3c and 3d differs from the pin of FIGS. 3a to 3b in that the pin comprises elastically-deformable, axially-running protrusions or ribs 18 on the outer surface of the pin 17. The ribs 18 are configured to be inwardly compressed as the pin is pushed past the first displacement stop 14 illustrated in FIGS. 2a to 2c, and then to resile outwards again, thereby increasing the stopping or braking effect preventing the locking pin from being axially displaced once it is in its locking position.

In the illustrated example, the mounting peg 2 has a small opening at its distal end. When the locking pin is in its locking position at the distal end of the pin channel 16, it is possible to push the locking pin 17 forcibly, for example by inserting an elongated element through this opening and exerting a force to displace the locking pin in the pin channel 16 towards its initial position (in the second axial direction). If the force is sufficient to overcome the stopping or blocking effect of the first displacement stop 14, the locking pin may be deliberately pushed out of its locking position. It is thus possible to unlock the mounting peg 2 and thereby remove the motor from the PCB by pushing the mounting pegs 2 out of the mounting holes of the PCB.

Figure 4A:
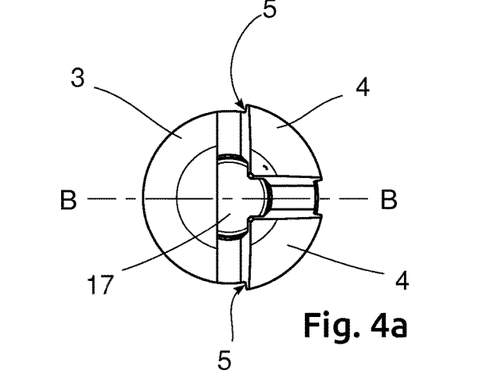
FIG. 4a shows a plan view of an example of a mounting peg according to a second embodiment of the invention, with the locking pin in its initial position.
Figures 4B, 4D:
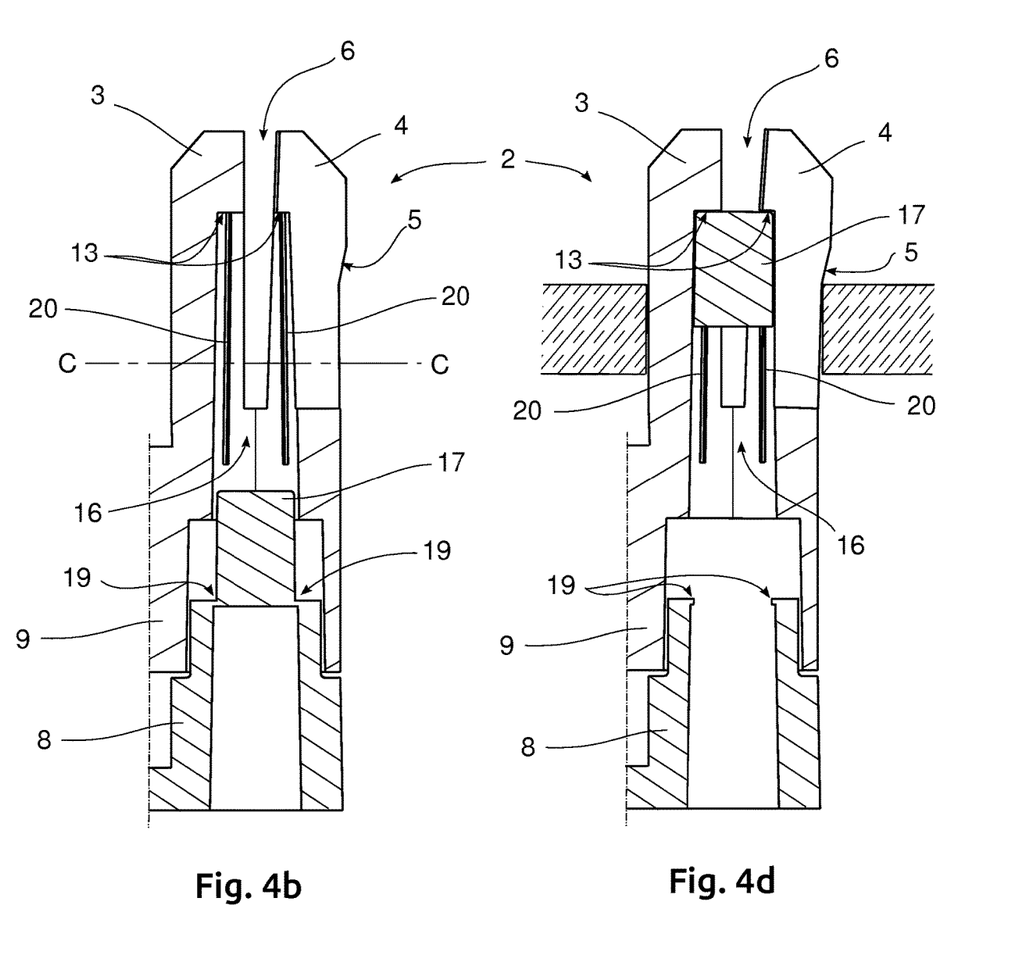
FIG. 4b shows a vertical cross-sectional view of the mounting peg of FIG. 4a through B-B, with the locking pin its initial position.
FIG. 4d shows a vertical cross-sectional view of the mounting peg of FIGS. 4a through 4c, with the locking pin moved to its locking position.
Figure 4C:
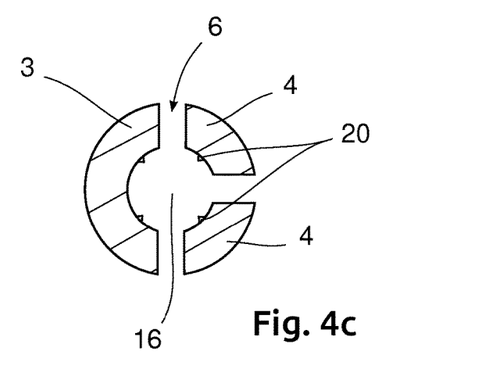
FIG. 4c shows a horizontal cross-sectional view of the mounting peg of FIG. 4b through C-C.
Figure 4E:
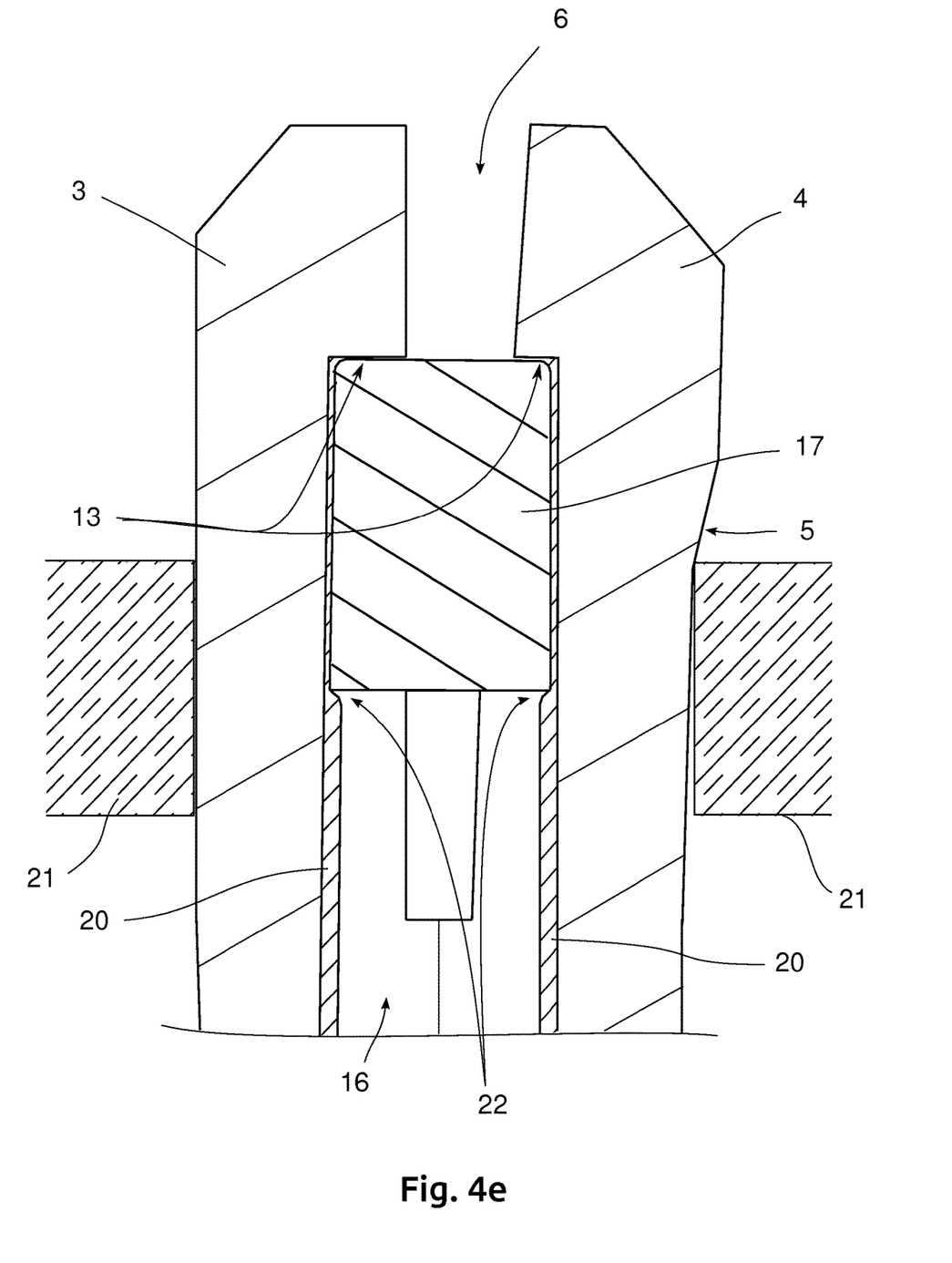
FIG. 4e shows an enlarged partial cross-sectional view of the mounting peg of FIG. 4d, the cross-section taken at a different angle.
Figure 5:
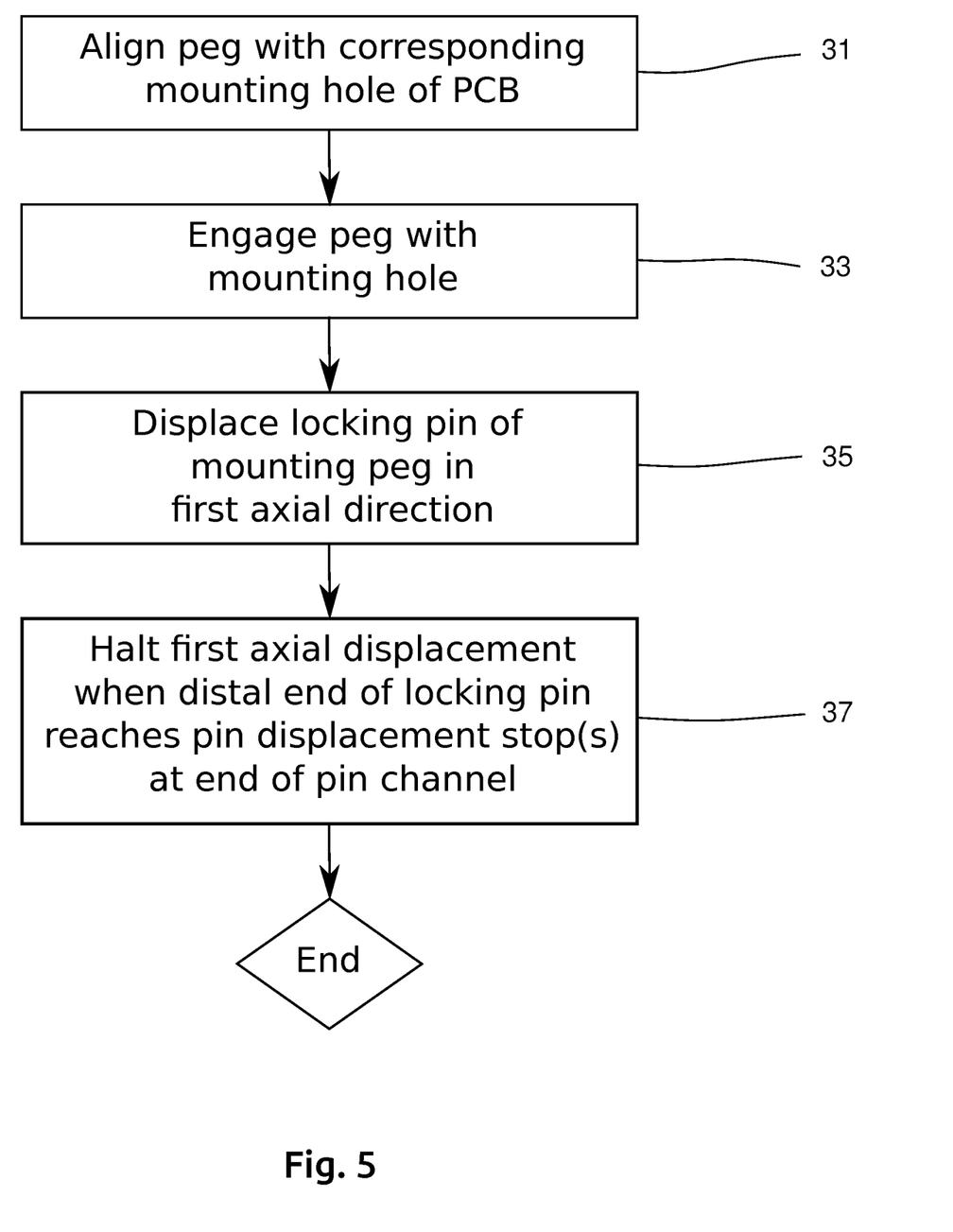
FIG. 5 is a flow chart illustrating a method of mounting a component on a circuit board according to one aspect of the present invention.

The second embodiment is illustrated in FIGS. 4a to 4e. FIG. 4b is a vertical cross-section in plane B-B of FIG. 4a, while FIG. 4c is a horizontal cross-section in plane C-C of FIG. 4b. The second embodiment is similar to the first embodiment. However, according to the second embodiment, the structure of the first displacement stop is different from that of the first embodiment. According to the second embodiment, the first displacement stop comprises elastically deformable protrusions, also referred to as ribs 20, on the inner wall of the pin channel 16. The ribs 20 are configured to be locally deformed outwardly by the presence in the pin channel of the locking pin 17 as it passes along the ribs 20 during the first axial displacement from the initial position to the locking position, and to resile inwardly after the locking pin has passed. Thus, when the locking pin 17 reaches the locking position, each of the ribs resiles inwardly to forms a shoulder 22, which prevents the peg from accidentally moving back from the locking position in the second axial direction (ie back towards its initial position). The ribs 20 may be formed as a plurality of protrusion sections arranged axially along the wall of the pin channel. However, the or each elastically deformable protrusion may advantageously be formed as a continuous axial rib of elastically deformable material. The moulding process for forming such a continuous axial rib shape, without any overhanging parts, is significantly simpler. The ribs 20 and the mounting peg 2 may be formed from the same material. Alternatively, they may be formed from different materials.

One aspect of the present invention relates to a method of mounting a component on a circuit board. The component comprises at least one mounting peg 2 as described above. Referring to the flow chart of FIG. 7, an exemplary mounting method is next briefly described. In step 31 the mounting pegs 2 are aligned with a corresponding mounting hole of the PCB 21. In step 33 the component is inserted such that the said mounting peg 2 engages in a positive-fit engagement with the mounting hole. In step 35 the first axial displacement of the locking pin of the mounting pegs 2 is effected in the first axial direction so that the locking pin 17 is now in the second or locking position. During this step, if the mounting pegs 2 are according to the second embodiment, the elastically deformable protrusion(s) 20 is/are locally deformed outwardly by the first axial displacement of the locking pin as it passes. In step 37 the first axial displacement of the pin is halted when the distal end of the locking pin 17 reaches the at least one shoulder or protrusion 13. At this point, the elastically deformable protrusion(s) 20 resile behind the locking pin, preventing it from being accidentally displaced in the second axial direction. If the mounting pegs 2 are according to the first embodiment, a corresponding blocking or stopping function is performed by the ridge/protrusion 14, and optionally by the ribs 18 on the locking pin 17.

While the invention has been illustrated and described in detail in the drawings and foregoing description, such illustration and description are to be considered illustrative or exemplary and not restrictive, the invention being not limited to the disclosed embodiment. Other embodiments and variants are understood, and can be achieved by those skilled in the art when carrying out the claimed invention, based on a study of the drawings, the disclosure and the appended claims. For instance, the component to be retained on the circuit board could be also a specifically designed motor adapter for connecting the motor 1 to the PCB 21 by use of the adapter. Of course the component could be also any other component which is to be retained in the above manner on a circuit board.

In the claims, the word "comprising" does not exclude other elements or steps, and the indefinite article "a" or "an" does not exclude a plurality. The mere fact that different features are recited in mutually different dependent claims does not indicate that a combination of these features cannot be advantageously used. Any reference signs in the claims should not be construed as limiting the scope of the invention.

The invention claimed is:

1. A mounting peg for retaining a component on a circuit board, the mounting peg being securable in a mounted position by a first axial displacement of a locking pin along a pin channel of the mounting peg in a first axial direction along a longitudinal axis of the mounting peg from a first axial position to a second axial position, hereafter referred to as the locking position, the pin channel comprising a first pin displacement stop and a second pin displacement stop for stopping a second axial displacement of the locking pin out of the locking position, at least the second pin displacement stop comprising at least one shoulder formed in a wall of the pin channel, the shoulder of the second pin displacement stop being shaped for engaging with a distal end of the locking pin so as to prevent a displacement of the distal end past the shoulder in the first axial direction, wherein the first pin displacement stop comprises an elastically deformable shoulder or protrusion from the wall of the pin channel, the elastically deformable shoulder or protrusion being configured to be deformed outwardly by the first axial displacement of the locking pin as the locking pin passes the elastically deformable shoulder or protrusion, and to resile inwardly after the locking pin has passed, and wherein the first pin displacement stop is positioned, and the locking pin sized and shaped so as to engage with a proximal end of the locking pin.

2. The mounting peg according to claim 1, wherein the second axial displacement is in the first axial direction.

3. The mounting peg according to claim 1, wherein the second axial displacement is in a second axial direction, opposite to the first axial direction.

4. The mounting peg according claim 1, wherein the deformable shoulder or protrusion of the first pin displacement stop is formed as a plurality of protrusion sections arranged axially along the wall of the pin channel.

5. The mounting peg according to claim 4, wherein the plurality of deformable protrusion sections are formed as a continuous axial rib of elastically deformable material.

6. The mounting peg according to claim 1, wherein the mounting peg and the elastically deformable shoulder or protrusion are formed from the same material.

7. The mounting peg according to claim 1, comprising a plurality of longitudinal wall sections arranged around the pin channel, the longitudinal wall sections being separated from each other by slits, wherein the said shoulder is formed on an inner wall of at least one of the longitudinal wall sections.

8. The mounting peg according to claim 1, wherein a distal end of the locking pin comprises a chamfered end.

9. The mounting peg according to claim 1, wherein the locking pin comprises at least one axially running protrusion on the surface of the locking pin.

10. The mounting peg according to claim 1, wherein the mounting peg is a press-fit mounting peg.

11. A stepper-motor comprising at least one mounting peg according to claim 1.

12. A circuit board for a dashboard of a vehicle, the circuit board comprising a stepper-motor according to claim 11.

13. A method of mounting a component on a circuit board, the component comprising at least one mounting peg comprising a pin channel comprising a first pin displacement stop and a second pin displacement stop, the method comprising the steps of:
   aligning the or each mounting peg with a corresponding mounting hole of the circuit-board,
   inserting the component such that the said mounting peg engages in a positive-fit engagement with the mounting hole,
   effecting a first axial displacement of a locking pin of the or each mounting peg along the pin channel of the or each mounting peg in a first axial direction,
   halting the first axial displacement when the distal end of the locking pin reaches the second pin displacement stop formed at a distal end of the pin channel,
   wherein the first pin displacement stop comprises an elastically deformable shoulder or protrusion from a wall of the pin channel, and when effecting the first axial displacement of the locking pin, the elastically deformable shoulder or protrusion deforms outwardly by the first axial displacement of the locking pin as the locking pin passes the elastically deformable shoulder or protrusion, and resiles inwardly after the locking pin has passed, and wherein the first pin displacement stop is positioned, and the locking pin sized and shaped so as to engage with a proximal end of the locking pin.

* * * * *